United States Patent
Kang et al.

(10) Patent No.: US 12,354,991 B2
(45) Date of Patent: Jul. 8, 2025

(54) REPLACEMENT BURIED POWER RAIL IN BACKSIDE POWER DELIVERY

(71) Applicant: Tokyo Electron Limited, Tokyo (JP)

(72) Inventors: Hoyoung Kang, Schenectady, NY (US); Lars Liebmann, Mechanicville, NY (US); Jeffrey Smith, Clifton Park, NY (US); Anton Devilliers, Clifton Park, NY (US); Daniel Chanemougame, Niskayuna, NY (US)

(73) Assignee: Tokyo Electron Limited, Tokyo (JP)

( * ) Notice: Subject to any disclaimer, the term of this patent is extended or adjusted under 35 U.S.C. 154(b) by 545 days.

(21) Appl. No.: 16/782,882

(22) Filed: Feb. 5, 2020

(65) Prior Publication Data

US 2020/0266169 A1    Aug. 20, 2020

Related U.S. Application Data

(60) Provisional application No. 62/807,451, filed on Feb. 19, 2019.

(51) Int. Cl.
  *H01L 23/00*    (2006.01)
  *H01L 21/308*   (2006.01)
  (Continued)

(52) U.S. Cl.
  CPC .......... *H01L 24/20* (2013.01); *H01L 21/308* (2013.01); *H01L 21/3212* (2013.01);
  (Continued)

(58) Field of Classification Search
  CPC ... H01L 24/20; H01L 23/481; H01L 23/5286; H01L 21/76877; H01L 21/76898;
  (Continued)

(56) References Cited

U.S. PATENT DOCUMENTS

| 9,570,395 B1 | 2/2017 | Sengupta et al. |
| 10,020,381 B1 | 7/2018 | Fan et al. |

(Continued)

FOREIGN PATENT DOCUMENTS

KR   10-2017-0057820 A   5/2017

OTHER PUBLICATIONS

International Search Report and Written Opinion issued Jun. 9, 2020 in PCT/US2020/017427, 10 pages.
(Continued)

*Primary Examiner* — Shaun M Campbell
*Assistant Examiner* — Aneta B Cieslewicz
(74) *Attorney, Agent, or Firm* — Oblon, McClelland, Maier & Neustadt, L.L.P.

(57) ABSTRACT

Aspects of the disclosure provide a method for fabricating a semiconductor device. The method includes forming dummy power rails on a substrate by accessing from a first side of the substrate that is opposite to a second side of the substrate. Further, the method includes forming transistor devices and first wiring layers on the substrate by accessing the first side of the substrate. The dummy power rails are positioned below a level of the transistor devices on the first side of the substrate. Then, the method includes replacing the dummy power rails with conductive power rails by accessing from the second side of the substrate that is opposite to the first side of the substrate.

3 Claims, 4 Drawing Sheets

(51) Int. Cl.
*H01L 21/321* (2006.01)
*H01L 21/768* (2006.01)
*H01L 23/48* (2006.01)
*H01L 23/495* (2006.01)
*H01L 23/528* (2006.01)
*H10D 84/01* (2025.01)
*H10D 84/03* (2025.01)

(52) U.S. Cl.
CPC .. *H01L 21/76877* (2013.01); *H01L 21/76898* (2013.01); *H01L 23/481* (2013.01); *H01L 23/49531* (2013.01); *H01L 23/49562* (2013.01); *H01L 23/5286* (2013.01); *H10D 84/0149* (2025.01); *H10D 84/038* (2025.01)

(58) Field of Classification Search
CPC ........... H01L 21/76843; H01L 21/3212; H01L 21/30625; H01L 21/3065; H01L 21/308; H01L 21/823475; H01L 21/49531; H01L 21/49562
See application file for complete search history.

(56) References Cited

U.S. PATENT DOCUMENTS

| | | | |
|---|---|---|---|
| 10,319,835 | B2 | 6/2019 | Fan et al. |
| 10,475,692 | B2 | 11/2019 | Licausi et al. |
| 10,490,653 | B2 | 11/2019 | Fan et al. |
| 10,586,765 | B2 | 3/2020 | Smith et al. |
| 10,636,739 | B2 | 4/2020 | Beyne et al. |
| 2002/0020862 | A1* | 2/2002 | Livengood ...... H01L 21/823871 257/E21.597 |
| 2004/0150026 | A1* | 8/2004 | Kong ................ H01L 23/5286 257/E21.582 |
| 2012/0068303 | A1* | 3/2012 | Chu ................ H01L 23/5283 257/E29.325 |
| 2012/0292777 | A1* | 11/2012 | Lotz ................ H01L 23/5286 438/459 |
| 2015/0187642 | A1 | 7/2015 | Batra et al. |
| 2015/0255404 | A1* | 9/2015 | Adkisson .......... H01L 23/53266 257/774 |
| 2016/0284731 | A1* | 9/2016 | McMullan ........ H01L 21/76877 |
| 2018/0145030 | A1 | 5/2018 | Beyne et al. |
| 2018/0294267 | A1 | 10/2018 | Licausi et al. |
| 2018/0337257 | A1 | 11/2018 | Fan et al. |
| 2018/0337260 | A1 | 11/2018 | Fan et al. |
| 2018/0374791 | A1 | 12/2018 | Smith et al. |
| 2020/0006112 | A1 | 1/2020 | Licausi et al. |
| 2020/0105671 | A1* | 4/2020 | Lai .................... G06F 30/39 |
| 2020/0135634 | A1* | 4/2020 | Chiang ................ H01L 21/743 |

OTHER PUBLICATIONS

Supplementary European Search Report issued Nov. 8, 2022, in corresponding European Patent Application No. 20760073.5.

Office Action issued Mar. 13, 2024, in Taiwanese Patent Application No. 109104174 filed Feb. 11, 2020, 11 pages (with English Translation).

Office Action issued Jan. 16, 2024, in corresponding Japanese Patent Application No. 2021-548212, 4 pages.

Office Action issued Aug. 19, 2024, in corresponding Korean Patent Application No. 10-2021-7026714, 12 pages (with English translation).

* cited by examiner

REPLACEMENT BURIED POWER RAIL IN BACKSIDE POWER DELIVERY

INCORPORATION BY REFERENCE

This present application claims the benefit of priority to U.S. Provisional Application No. 62/807,451, "Replacement Buried Power-Rail in Backside Power Delivery" filed on Feb. 19, 2019, which is incorporated by reference herein in its entirety.

TECHNICAL FIELD

The present disclosure describes embodiments generally related to semiconductor devices and manufacturing process.

BACKGROUND

Historically, in semiconductor industry, transistors have been created in one plane, with wiring/metallization formed above, and have thus been characterized as two-dimensional (2D) circuits or 2D fabrication. Scaling efforts have greatly increased the number of transistors per unit area in 2D circuits. As traditional 2D scaling is showing rapidly reduced return on investment, the semiconductor industry is looking to the $3^{rd}$ dimension to maintain node-to-node improvement in power-performance-area-cost (PPAC). A very promising approach to utilizing the vertical axis in improving transistor density is a new device architecture known as complementary FET (CFET). In the CFET approach, a logic cell having N-type device and P-type device is essentially folded, such that one of the two devices, such as P-type device, is disposed on-top of the other device of the two devices, such as the N-type device while sharing a common gate.

SUMMARY

This disclosure pertains to device fabrication of both memory and logic incorporating either fin field effect transistor (FINFET), nanowires, nanosheets, or complimentary stacked nanowires and/or nanosheets. Within standard logic cells, power to the devices (e.g., transistors) is supplied to the source/drain contacts through power rails which connect to the rest of the power delivery network (PDN) in back-end of line (BEOL) metal layers. The power rails typically run across adjacent cells in an orientation that is typical referred to as east-west orientation. Since the power rails need to supply power to a number of cells, the power rails are often implemented with much larger sizes (e.g., larger width) compared to standard routing tracks/signal lines that are used within the cells. Typically the size difference of the power rail compared to a normal routing line can be as large as 3 to 4 times, thus the power rails use a significant amount of area within the cell design. The larger critical dimension of the power rails is needed to maintain an adequate resistance through the rail in order to maintain adequate power distribution targets including IR drop and frequency of which the power rails need to be supplied within the device.

An approach has been devised to reduce the lateral (width) size of the power rails through making them deeper (e.g. higher aspect ratio) in size in order to allow a smaller top-down cross-section (e.g., smaller width metal lines) while effectively keeping the total metal volume in the power rail either the same or increased. The increase in aspect ratio provides for lower resistance across the power rail which provides the ability to maintain improved IR drop and reduces the frequency at which the power rail needs to be supplied. Simply increasing the aspect ratio of the power rail in the lowest level of metal is often difficult as it would drive larger aspect-ratio vias to connect signal lines to the device (e.g. higher via resistance), or would require the signal lines to also have similar aspect ratio which would cause increased capacitance between tracks in the BEOL. One approach includes "burying" or positioning the power rails underneath a physical device (e.g. transistor), where the aspect ratio of the power rail can be increased independent of the signal lines in the BEOL, this providing a means to significantly lower resistance through the power rail without driving any negative impact to either via resistance or capacitance in the BEOL. In this method, power is supplied to the metal contacts through a bottom-up approach as opposed through the conventional wiring structure with power rails positioned either in plane with, or above, a transistor cell.

Positioning or burying the power rail under the physical device allows cell area reduction. For example, generally cells are realized as fixed-height, variable-width cells in standard cell layout library. The fixed height enables cells to be placed in rows, and eases the process of automated layout design. The row direction is the orientation that is referred to as east-west orientation, and a direction that is perpendicular to the east-west orientation is referred to as north-south orientation. With this naming convention, M0 would typically contain lines running in an east-west orientation while M1 would have lines running in a north-south orientation. Subsequent metal layers would run perpendicular with respect to the preceding metal layers.

Burying the power rail under the physical device enables cell height reduction. By convention, the height of a given standard cell is reported in number of metal tracks rather than physical dimensions. For example, a six track (6T) cell is 6 metal pitches tall. For a metal pitch of 40 nm, a 6T cell is 240 nm tall (regardless of how many metal tracks are actually used in its design). Various standard cell designs can use more or less tracks, but logic cells typically require at least 4 signal routing tracks on M0 to complete the first stage of signal wiring of transistors. Power supply requirements typically limit the power-rail to a width equivalent to 3 metal half-pitches, making a corresponding cell 12 half-pitches, which is 6 pitches tall or 6T. Burying the power rail allows a respective cell height to be reduced to 4T or smaller.

Connections to either Vss or Vdd for cells in a same row that extends in east-west direction can be done along a common power rail. Further, connections to either Vss or Vdd for two adjacent rows can be done along a common power rail. In an example, a power rail (e.g., Vdd) is located between an upper row of standard cells and a lower row of standard cells. The power rail runs in the east-west orientation. The cells in the upper row are north-facing, and the cells in the lower row are southern-facing, and can use commonly the power rail as Vdd power supply for example. The power rail can be tapped by the north-facing cells in the upper row and can likewise be tapped by the adjacent southern-facing cells in the lower row. For the case of a large non-buried rail, this can be accommodated since there is adequate space on the rail to make both connections, and those connections are done from a top-down integration approach where a via is transferred through the rail to the metal drain (such as a channel or a tunnel for metallization) underneath. Accordingly, any alignment done in either the lithography or patterning will be directly transferred by the etch process. Regarding the embodiment of a buried rail, however, the power rail can be encased either within the shallow-trench isolation (STI) or within the bulk silicon and STI together, depending on how large of an aspect ratio is necessary to meet resistance specifications. Making a connection down through the oxide fill of the replacement metal drain and landing on the metal rail and not the STI physically adjacent to the rail can be difficult to execute. Any placement error would result in additional metal fill of the rail since the next steps of the process would be to metalize the metal drain after making connection to the buried rail. Conversely, any placement error where inadequate connection is made to the power rail provides a significant resistance penalty, especially in designs in which the connection between rail and metal drain is less than 12 nm in size.

For cases where two source/drain contacts from two neighboring cells in the north-south orientation are pulling down from a common power rail, the source/drain contacts or electrodes between both standard cells can actually be shared which enables the placement of the via connecting to (a) be increased in diameter in order to improve via resistance, and (b) placed any place within the width of the power rail, thus providing some edge-placement error (EPE) relief.

Several additional, challenges arise with the integration of burying power rails underneath the active device. These problems are also affected by several factors including the size of the rail to be used, location in the integration process sequence that the buried rail is to be implemented, the placement of the buried power rails in proximity to silicon or SiGe fin structures (or Si/SiGe fin superlattice used in the nanosheet gate-all-around (GAA) process), density and location of where these rails are tapped (both within a single standard cell as well as between two adjacent cells in the north-south orientation), the metal used for the buried rail along with any associated liners required for metallization of the rail and its subsequent connection to the metal drain, and thermal restrictions of how and where in the integration the buried power rail is created.

Example embodiments herein primarily focus on describing application for buried power rails. This application is non-limiting though. Embodiments herein can be extended to cover any back-side wiring such as routing lines or local interconnect or cell-to-cell interconnect lines that exist below the physical device, as well as buried power distribution networks supplying the power rails directly from the back of the wafer.

Currently there is no method to self-align any wiring done on the bottom-end of the physical device. This is regardless of whether the wiring includes buried power rails, buried wordline for memory, buried interconnect lines, buried routing lines, buried inter-cell wiring lines for logic, et cetera.

Enabling the multiple method of self-alignment as disclosed herein provides the ability to significantly scale cell height for logic designs from current 6.5T down to 5T or even further below, if implemented in conjunction with other scaling concepts such as complimentary FET stacked nanosheet architectures, in which 4T or even 3T cell heights would be feasible with buried power rails. This also eventually provides a mechanism in which cells themselves can be stacked overtop of one another. In some examples, complimentary stacked nano-sheets (PMOS over NMOS) are disclosed. Such stacked devices can be used with embodiments herein of buried back-side wiring to extend to multiple cell stacking where placement or wires and/or other wiring can be done either below a physical device, in-between multiple physical devices, as well as above a physical device, as is currently the method for metallization.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Aspects of the disclosure provide a semiconductor device. The semiconductor device includes a dummy power rail formed in an isolation trench and optionally extending down into the bulk silicon. The dummy power rail is a place holder that uses a material different than a final conductive material. The dummy power rail can be covered by a dielectric cap or with a second deposition of STI oxide to isolate the dummy power rail from the HKMG (high-k metal gate), gate electrodes, and even source/drain electrodes. Further, an opening can be formed in the dielectric cap and filled with sacrificial material to selectively connect a source/drain electrode with the power rail. The sacrificial material or dummy material can be selected to resist damage from high heat annealing processing of transistor devices. After transistor devices are formed, and at least some metal wiring is completed on a front side of the substrate, the dummy power rails are accessed from a backside of the substrate and replaced with a desired conductive material.

Aspects of the disclosure provide a method for manufacturing a semiconductor device. The method includes accessing a substrate having a front side and a backside, the backside being opposite the front side. Dummy power rails are formed on the substrate by way of access from the front side of the substrate. In other words, patterning, etching and deposition processes happen from the front side of the substrate. The dummy power rails are positioned below a level of transistor devices. That is, all or a portion of the dummy power rails are positioned below. The transistor devices are formed on the substrate by way of access from the front side, as with the dummy power rails. Wiring layers are formed on the front side of the substrate including conductive structures connected to the dummy power rails. The dummy power rails are then uncovered by removing portions of the backside of the substrate. This can be done by chemical-mechanical polishing, mask-based etching, or blanket etching. Power rails are then formed by replacing the dummy power rails with a conductive material by way of access from the backside of the substrate. For example, dummy power rail material can be removed by selective etching. Conductive material can then be added by selective deposition, or damascene fill, or other deposition method. By forming dummy power rails relatively deep within the bulk silicon, accessing from the backside can be easier or more accurate because dummy material provides self-alignment for replacement structures.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the disclosure and embodiments, the reader is directed to the Detailed Description section and corresponding figures of the present disclosure as further discussed below.

Aspects of the disclosure provide a method for fabricating a semiconductor device. The method includes forming dummy power rails on a substrate by accessing from a first side of the substrate that is opposite to a second side of the substrate. Further, the method includes forming transistor devices and first wiring layers on the substrate by accessing the first side of the substrate. The dummy power rails are positioned below a level of the transistor devices on the first side of the substrate. Then, the method includes replacing the dummy power rails with conductive power rails by accessing from the second side of the substrate that is opposite to the first side of the substrate.

Aspects of the disclosure also provide a semiconductor device. The semiconductor device includes transistor devices and first wiring layers formed on a first side of a substrate, and includes second wiring layers formed on a second side of the substrate that is opposite to the first side. Further, the semiconductor device includes conductive rails formed in the substrate below the transistor devices and first wiring layers. The conductive rails interconnect the second wire layers on the second side of the substrate with the transistor devices and the first wiring layer on the first side of the substrate. The conductive rails are formed of a conductive stack including at least one conductive material (e.g., copper) with a threshold temperature for thermal stability being lower than a processing temperature for the transistor devices and the first wiring layers. In some examples, the second wire layers form a power delivery network, and the conductive rails are power rails to transmit power from the power delivery network to the transistor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide techniques for replacement buried power rail in backside power delivery. The techniques are used to fabricate a semiconductor device on a substrate (e.g., wafer substrate) that has a first side (also referred to as a front side) and a second side (also referred to as a backside). In some embodiments, transistors and buried dummy power rails are formed by accessing the first side of the substrate and performing manufacturing processes on the first side of the substrate. The buried dummy power rails are positioned below a level of the transistors (when the first side is facing up). Further, wires are formed on the first side of the substrate to connect the dummy power rails to the transistors and interconnect the transistors. Then, the buried dummy power rails are replaced with one or more conductive materials to form real power rails. The replacement of the dummy power rails with the real power rails is performed by accessing from the second side of the substrate. It is also noted that, in some examples, a backside power delivery network can be formed on the second side.

Figure 1:
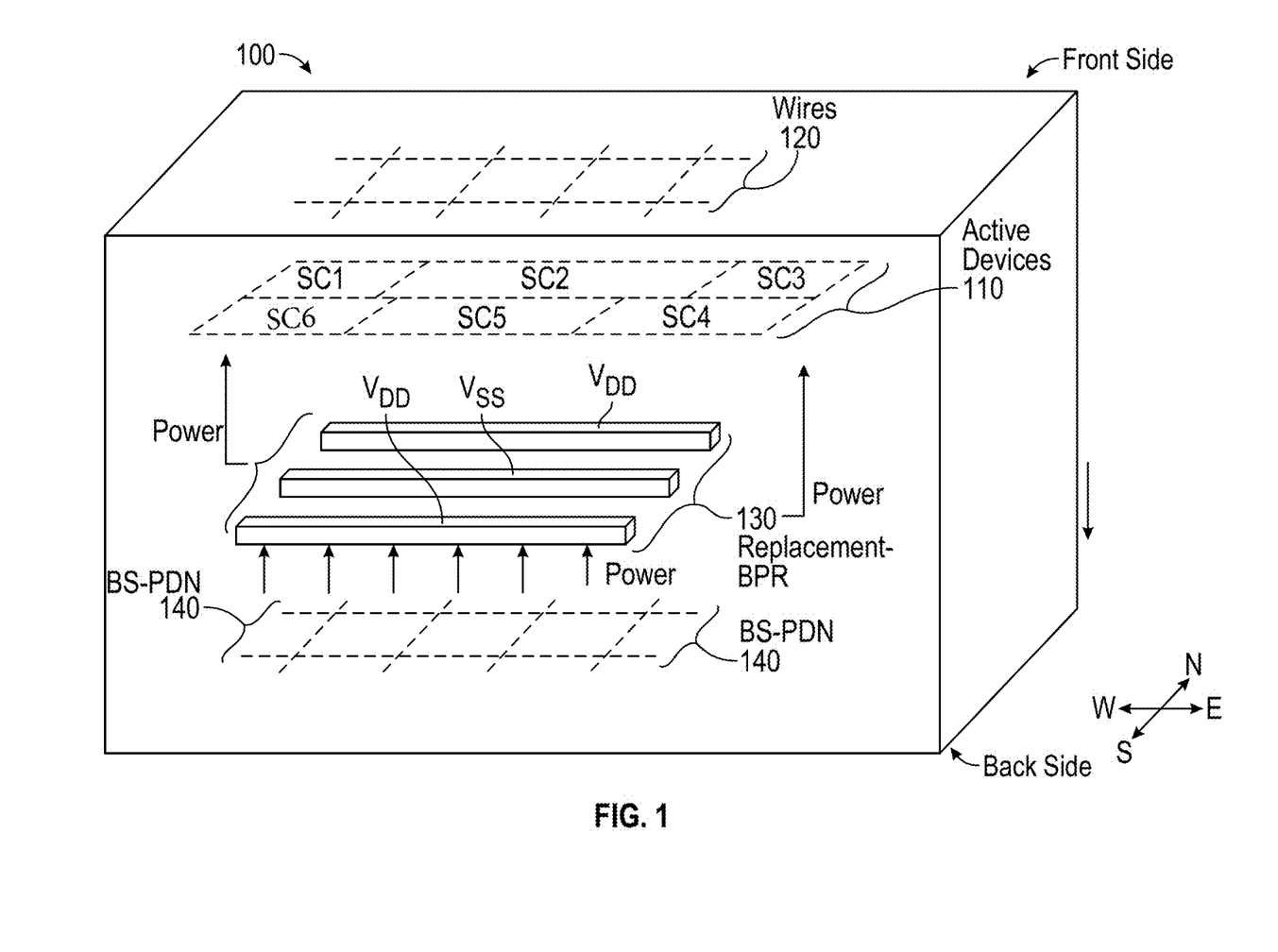
FIG. 1 shows a diagram illustrating a semiconductor device according to some embodiments of the disclosure.

FIG. 1 shows a diagram illustrating a semiconductor device 100 according to some embodiments of the disclosure. The semiconductor device 100 is formed on a substrate, and includes buried power rails 130 that are formed by replacing dummy power rails (not shown) from a backside of the substrate. The semiconductor device 100 also includes a backside power delivery network (BS-PDN) 140 formed on the backside of the substrate and delivers power to the buried power rails 130. The buried power rails 130 provide power to active devices 110, such as transistors. The active devices 110 are formed by processing on the front side of the substrate. The semiconductor device 100 can also include wires 120 for interconnecting the active devices 110. The wires 120 can be formed by processing on the front side of the substrate.

It is noted that the semiconductor device 100 can be any suitable device, for example, a semiconductor chip (or die), a semiconductor wafer with multiple semiconductor dies formed on the semiconductor wafer, a stack of semiconductor chips, a semiconductor package that includes one or more semiconductor chips assembled on a package substrate, and the like.

According to some aspects of the disclosure, active devices 110 can be any suitable devices, such as logic circuits, analog circuits, memory devices and the like. The active devices 110 are formed in layers that are suitably deposited and patterned. In some embodiments, the logic circuits are implemented using standard cells (SC), such as inverter cells, NAND cells, NOR cells, and the like from a standard cell library. Each of the standard cells is configured to perform one or more operations. In an example, an inverter cell is configured to perform a logic inversion operation, thus the inverter cell generates an output having an inverted logic value of an input.

The buried power rails 130 are formed under the physical devices (e.g., active devices, transistors) to allow cell footage reduction. For example, generally standard cells in a standard cell library are realized as fixed-height, variable-width cells. The fixed height enables cells to be placed in rows, and eases the process of automated layout design. In some examples, the row direction is an orientation referred to as east-west orientation, and a direction that is perpendicular to the east-west orientation is referred to as north-south orientation.

Burying the power rails under the physical devices can allow for the cell height of the standard cell to be defined by the number of routing tracks or signal lines as opposed to a combination of power rails and routing tracks. Burying the power rails under the physical devices decouples power-rail resistance from cell height and allowing for more aggressive area scaling. In some examples, the cell height can be scaled easily down from a 6.0 to 6.5 routing tracks (6.5T) cell height (assuming either a power rail width equal to either 2 or 3 times that of a routing track line) to a 5.0 routing track cell height through incorporation of this concept, even if the number of actual routing tracks are the same.

In the FIG. 1 example, the buried power rails for $V_{DD}$ and $V_{SS}$ are alternatively disposed in parallel and are extended respectively in the east-west orientation. In some embodiments, shallow-trench isolation (STI) is used to isolate active devices. The buried power rails can be encased either within the STI or within the bulk silicon and STI together, and the buried power rails are buried below a plane of layers that form the active devices. In some embodiments, rail openings can be formed in the STI, and down into the bulk silicon, then the rail openings can be filled with sacrificial insulator material (also referred to as dummy material). Then, in some embodiments, after the processing on the front side of the substrate, the substrate can be processed from the back to replace the dummy power rails with conductive material to form the real power rails. The detail process will be describe with reference to FIG. 2, FIGS. 3A-3C, and FIGS. 4A-4D.

In some embodiments, the rows of standard cells are also in the east-west orientation. The power rails can have a relatively wider width than regular routing tracks, such as about 2 or 3 times of width of the routing tracks. In some examples, adjacent rows of standard cells can be disposed of reverse orientations to share one power rail. For example, standard cells in a first row (e.g. SC1-SC3 in FIG. 1) are in a north-south orientation (e.g., $V_{DD}$ connections in the north, $V_{SS}$ connections in the south), and standard cells in a second row (e.g., SC4-SC6 in FIG. 1) are in a south-north orientation (e.g., $V_{DD}$ connections in the south, $V_{SS}$ connections in the north). When the first row is north of the second row, a $V_{SS}$ power rail can provide $V_{SS}$ to standard cells in both the first row and the second row.

Further, in the FIG. 1 example, the BS-PDN 140 is configured to feed power into the power rails from the back side of the substrate. In some examples, the BS-PDN 140 receives power from a power source (not shown). For example, the power source has a $V_{DD}$ terminal and a $V_{SS}$ terminal. $V_{DD}$ is used to represent the high voltage level side of the power source, such as 5V, 3V, 1.5V, and the like, and the $V_{SS}$ is used to represent the low voltage level side of the power source, such as ground in an example. The BS-PDN 140 is suitably configured to electrically couple to the $V_{DD}$ terminal of the power source to the $V_{DD}$ buried power rails, and electrically couple to the $V_{SS}$ terminal of the power source to the $V_{SS}$ buried power rails.

According to an aspect of the disclosure, during operation of the semiconductor device 100, transistors draw current from the power rails. For a given power-rail resistance, the distance over which current can be delivered to the transistors is limited by the associated voltage drop (referred to as IR drop) which leads to performance loss in the circuit. As power-rail resistance increases in advanced technology nodes, power needs to be fed into the power-rail more frequently (e.g. every 12 metal tracks). When the power is delivered to the power rails from the front side, the power delivery network may take up valuable wiring resources, cause wiring congestion, and ultimately limiting routing utilization (i.e. density with which standard cells can be placed and routed).

In the FIG. 1 example, power is delivery to the power rails from the back side by the BS-PDN 140, and the routings for signals can utilize the wires 120 that are formed on the front side of the substrate. Thus, in the FIG. 1 example, the BS-PDN 140 won't take up valuable wiring resources, or cause wiring congestion, or ultimately limit routing utilization. For example, the wires 120 formed on the front side of the substrate can be used for signal wiring, and the BS-PDN 140 on the back side of the substrate is used for feeding power to the power rails. Then the BS-PDN 140 is spatially separated from the signal wiring by being built entirely on the back side of the wafer. In some examples, the BS-PDN 140 can be connected to the BPR 130 using through silicon vias (μTSV).

Generally, IC fabrication includes a first portion of processes that is referred to as front-end-of-line (FEOL) process and a second portion of process that is referred to as back-end-of-line process. The FEOL process is used to pattern individual devices, such as transistors, capacitors, and the like in a substrate. FEOL covers everything up to (but not including) the deposition of metal interconnection layers. The BEOL process is used to interconnect individual devices with wiring formed in metallization layers. However, the buried power rails are positioned under the active devices, in some related examples, the power rails are formed and metalized before the anneal process on source/drain of transistors (e.g., before the active devices are fully formed). In the related example, the buried power rails are formed and metalized before the anneal process on source/drain of transistors, the metal need to have very good thermal characteristics on oxide. For example, the metal should be able to be stable under spike anneal temperatures, which can range between 700 C and 1100 C, as well as any deposition temperatures of films to be used. The related examples can preclude the use of metals such as copper (<450 C thermal stability), cobalt, or aluminum. In the related examples, ruthenium is selectable for metalizing a buried power rail.

Some aspects of the present disclosure provide a process flow that delays BPR metallization until after the FEOL process is completed (active devices are fully formed). Then, conductive material that has a lower threshold temperature for thermal stability can be used. Thus, in some embodiments, copper damascene process can be used for forming power rails in copper (threshold temperature for thermal stability is 450° C.). Copper generally costs less than ruthenium and has lower resistivity than ruthenium. The process flow can also achieve power rail resistance control and facilitate accurate fine-pitch alignment of the BS-PDN to the BPR.

Figure 2:
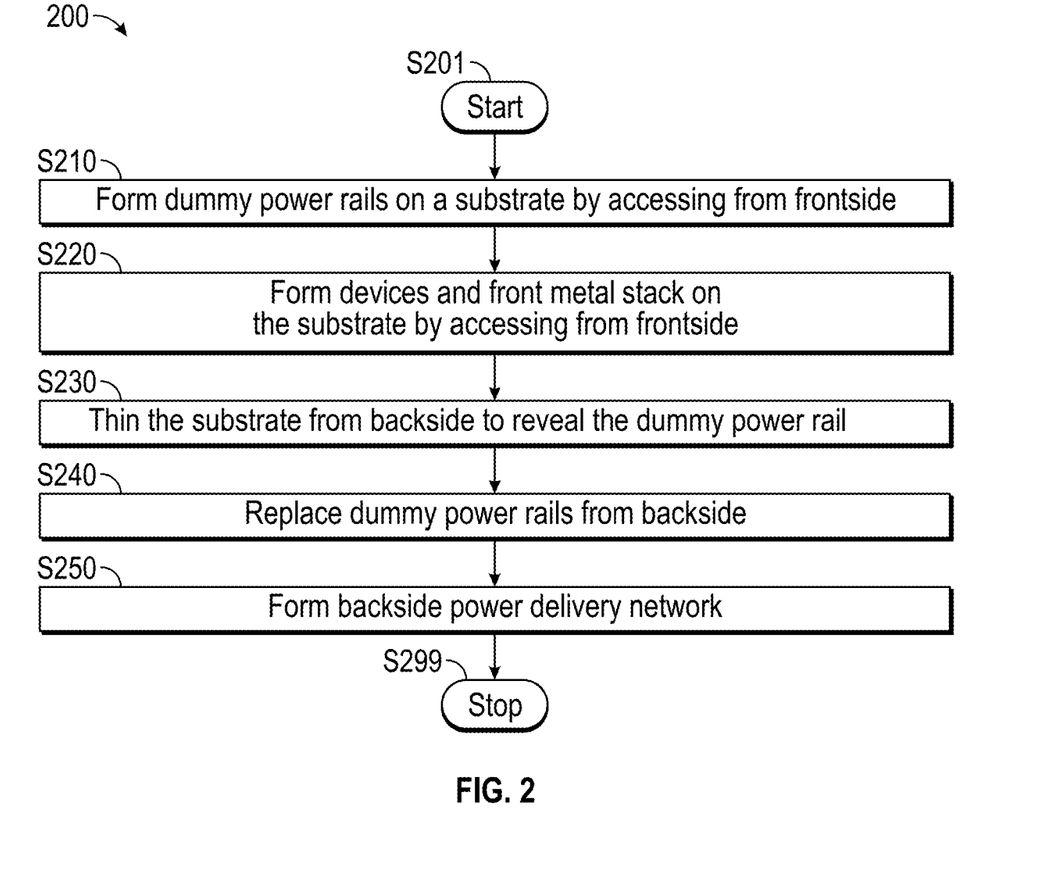
FIG. 2 shows a flow chart outlining a process example for fabricating a semiconductor device.

FIG. 2 shows a flow chart outlining a process example for fabricating a semiconductor device, such as the semiconductor device 100 on a substrate (e.g., wafer substrate). The process starts at S201 and proceeds to S210.

At S210, dummy power rails are formed on a substrate by accessing from a first side (front side) of a substrate. In some embodiments, shallow-trench isolation (STI) is formed to isolate active devices. The dummy power rails can be encased either within the STI or within the bulk silicon and STI together, and the dummy power rails are buried below a plane of layers that form the active devices. In some embodiments, rail openings can be formed in the STI, and down into the bulk silicon. In some embodiments, the rail openings are self-aligned to the active devices. For example, fin structures for forming active devices can be used to guide the rail openings. In an example, the rail openings can be formed into the substrate to a depth associated with a later wafer thinning process. The rail openings can be filled with sacrificial insulator, such as amorphous poly, nitride, carbon, and the like to form dummy power rails. In some examples, the sacrificial insulator includes an etch stop layer or a polish stop layer that is filled at the bottom of the rail openings in an example. Applicant's co-pending application Ser. No. 16/011,377, filed on Jun. 18, 2018, which is incorporated herein by reference in its entirety, discloses techniques for forming buried power rails. The techniques can be used to form dummy power rails using sacrificial insulator instead of conductive materials.

At S220, active devices and front metal stack (also referred to as first wires) are formed on the substrate by accessing from the front side. In some embodiments, the front side processing can be completed. The front side processing includes processes to form the active devices and the full metal stack on the front side of the substrate, such as the FEOL process and BEOL process that process on the front side of the substrate.

At S230, substrate is thinned from back side of the substrate. In some embodiments, the front side of the substrate is suitably protected and the substrate is flipped for back side processing. In an embodiment, the back side is thinned such that a portion of the bulk wafer material is removed to reveal (uncover) the dummy power rails. In an example (which will be described in detail with reference to FIGS. 3A-3C), a chemical mechanical polishing (CMP) process is used to remove a portion of the bulk wafer material from the back side to reveal the dummy power rail. In another example, an etch process is used to thin the substrate and reveal the dummy power rail. In another example, a grind process is used to thin the substrate and reveal the dummy power rail. In another example (which will be described in detail with reference to FIGS. 4A-4D), both CMP process and etch process are used to reveal the dummy power rail.

At S240, dummy power rails are replaced by accessing from the back side of the substrate. In an embodiment, the dummy power rails are removed. In an example, suitable etch process is used to remove the sacrificial insulator material of the dummy power rails (without significant removal of the substrate), and expose the rail openings for the power rails at the back side. Then, the power rail metallization is performed by damascene process from the back side. In an example, the rail openings are filled, from the back side, with a metal stack (e.g., a barrier layer and a copper layer) that overfills the rail openings. Then CMP process is performed to remove the overburden portion of the metal stack at the back side and keep the sunken portion of the metal stack in the rail openings.

At S250, back side power delivery network is formed. The process continues to form insulation layers and metal layers on the back side of the substrate to from back side power delivery network. Then, the process proceeds to S299 and terminates.

Figure 3A:
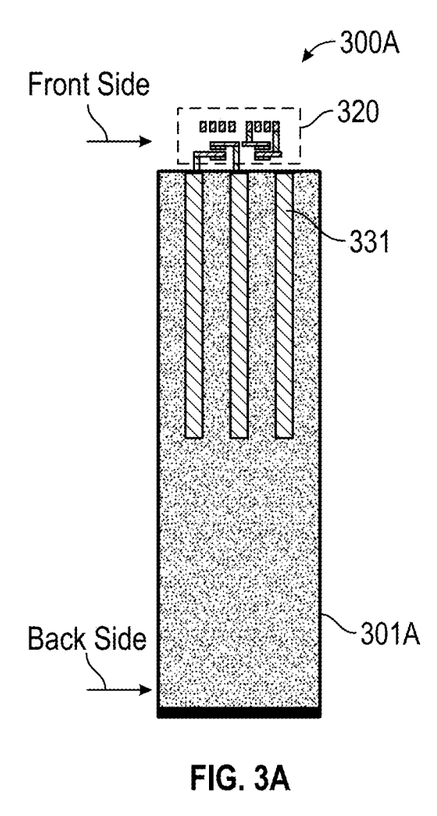
FIGS. 3A-3C show an example of a process for forming buried power rails on a substrate according to an embodiment of the disclosure.
Figure 3B:
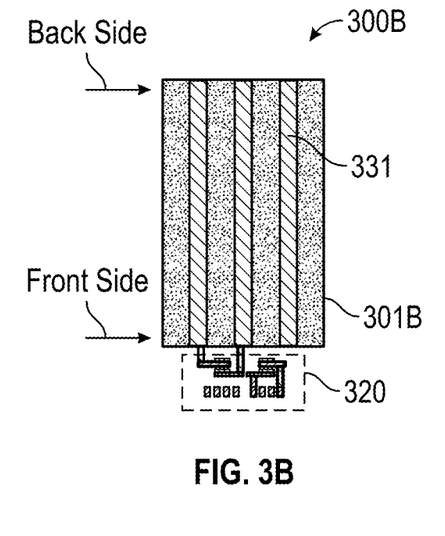
Figure 3C:
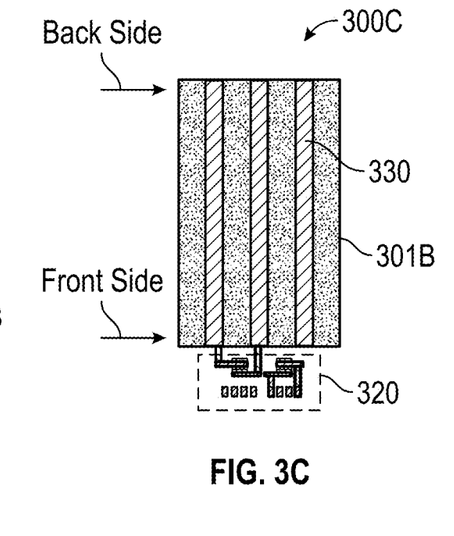

FIGS. 3A-3C show an example of a replacement process for buried power rails on a substrate (e.g., wafer substrate) according to an embodiment of the disclosure.

FIG. 3A shows a simplified cross-section 300A of the wafer substrate after front side processing. In the FIG. 3A example, dummy power rails 331 are formed in the wafer substrate, and active devices (not shown) and wires 320 in a plurality of metal layers (a single layer is shown) are formed on the front side of the wafer substrate. The wires 320 interconnect active devices and transmit signals to/from the active devices.

In the FIG. 3A example, the dummy power rails 331 are formed in deep trenches (rail openings). The deep trenches are filled with sacrificial insulator materials (e.g. amorphous poly, nitride, carbon). In some examples, the sacrificial insulator materials include a polish stopper material at the bottom of the deep trench. In an example, the deep trenches have a depth greater than 500 nanometers. In another example, the deep trenches have a depth in a range from a micro to hundreds of microns.

FIG. 3B shows a simplified cross-section 300B of the wafer substrate after a CMP process. In some examples, the CMP process is applied on the back side of the wafer substrate, and then wafer material is removed from the back side until the dummy power rails 331 are exposed, as shown by substrate 301A before CMP process and substrate 301B after CMP process. In an example, the CMP process can be applied until the polish stopper material is exposed.

FIG. 3C shows a simplified cross-section 300C of the wafer substrate after the dummy power rails 331 are replaced by real power rails 330. In an example, after the dummy power rails 331 are exposed, suitably etching process, such as a wet process with suitable etchants, is applied to remove the dummy power rails (without significant removal of the substrate material) from the back side of the substrate, thus the rail openings open from the back side.

Further, the rail openings are filled with metal from the back side. For example, the rail openings are filled, from the back side, with a metal stack (e.g., a barrier layer and a copper layer) that overfills the rail openings. Then CMP process is performed to remove the overburden portion of the metal stack and keep the sunken portion of the metal stack in the rail openings. The process then can continue to form layers of back side power delivery network.

It is noted that the example in FIGS. 3A-3C does not need through wafer alignment.

FIGS. 4A-4D show an example of another replacement process for buried power rails on a substrate (e.g., wafer substrate) according to an embodiment of the disclosure.

Figures 4A, 4B, 4C, 4D:
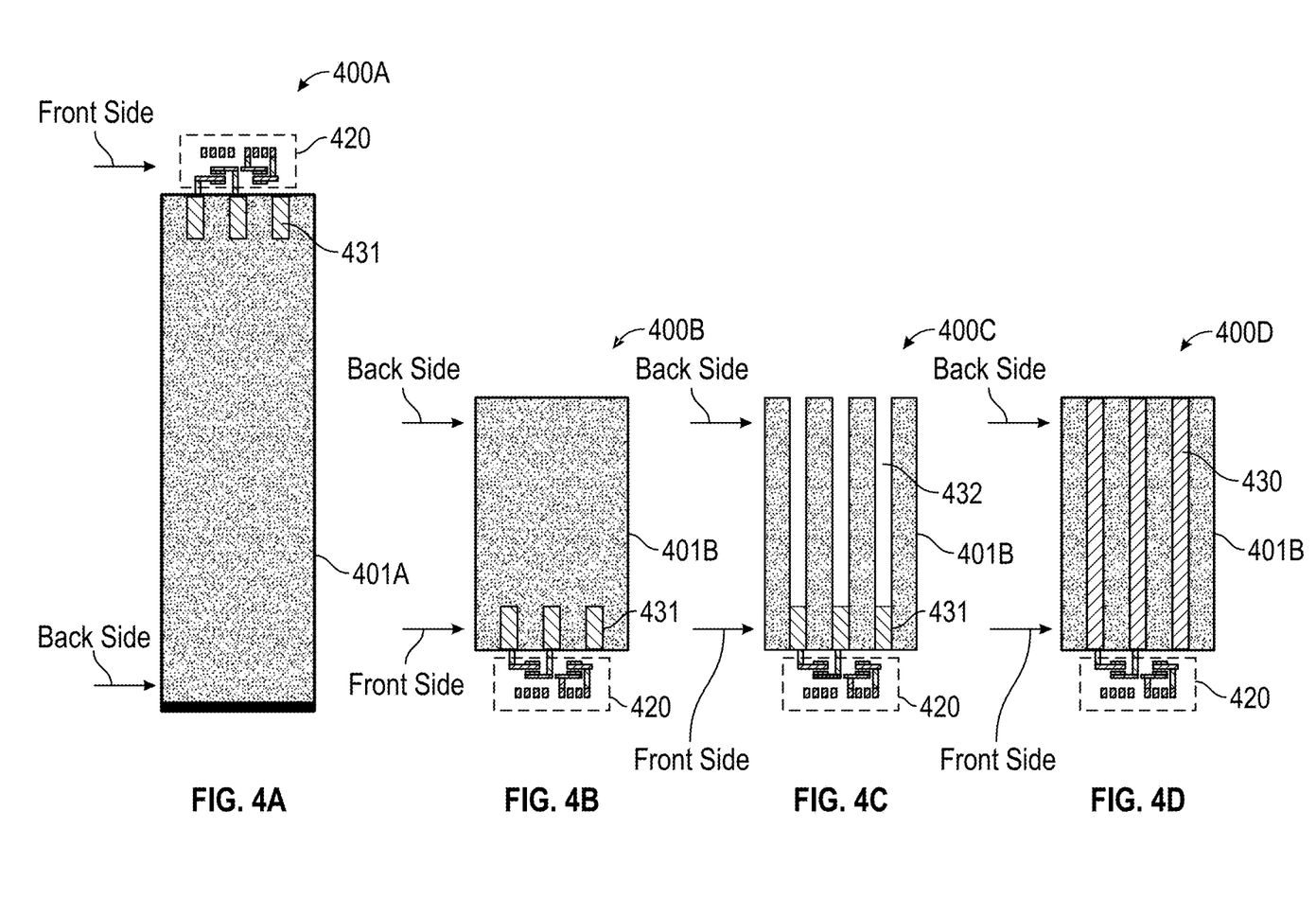
FIGS. 4A-4D show an example of another process for forming buried power rails on a substrate according to an embodiment of the disclosure.

FIG. 4A shows a simplified cross-section 400A of the wafer substrate after front side processing. In the FIG. 4A example, dummy power rails 431 are formed in the wafer substrate, and active devices (not shown) and wires 420 in a plurality of metal layers (a single layer is shown) are formed on the front side of the wafer substrate. The wires 420 interconnect active devices and transmit signals to/from the active devices.

In the FIG. 4A example, the dummy power rails 431 are formed in shallow trenches (rail openings). The shallow trenches are filled with sacrificial insulator materials (e.g. amorphous poly, nitride, carbon). In some examples, the sacrificial insulator materials include an etch stopper material at the bottom of the shallow trench. In an example, the shallow trenches have a depth in a range of 50 nanometers to 500 nanometers. In another example, the shallow trenches have a depth in a range of 10s of nanometers deep to a few hundred nanometers deep.

FIG. 4B shows a simplified cross-section 400B of the wafer substrate after a CMP process. In some examples, the CMP process is applied on the back side of the wafer substrate, and then wafer material is removed from the back side back, as shown by substrate 401A before CMP process and substrate 401B after CMP process. In an example, the CMP process can be stopped when the wafer substrate is thinned to certain thickness and not to expose the dummy power rails.

FIG. 4C shows a simplified cross-sectional view 400C of the wafer substrate after an etch process. In the FIG. 4C example, after the wafer substrate is thinned to certain thickness, a lithography process is performed to form an etch mask aligned with the dummy power rails. Then, an etch process can be performed to etch through the wafer and land on the dummy power rails. The etch process is referred to a like-through-silicon via (µTSV) etch that generate like-through-silicon vias 432. In an example, the µTSV etch can be applied until the etch stopper material is exposed, then the dummy power rails 431 are exposed.

FIG. 4D shows a simplified cross-section 400D of the wafer substrate after the dummy power rails 431 are removed and real power rails 430 are formed. In an example, after the dummy power rails are exposed, suitably etching process, such as a wet process with suitable etchants, is applied to remove the dummy power rails (without significant removal of the substrate material) from the back side of the substrate, thus the rail openings open from the back side.

Further, the rail openings are filled with metal from the back side. For example, the rail openings are filled, from the back side, with a metal stack (e.g., a barrier layer and a copper layer) that overfills the rail openings. Then CMP process is performed to remove the overburden portion of the metal stack and keep the sunken portion of the metal stack in the rail openings. The process then can continue to form layers of back side power delivery network.

It is noted that the example in FIGS. 4A-4D may rely on through wafer alignment.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:

transistor devices and first wiring layers formed on a first side of a substrate;

second wiring layers formed on a second side of the substrate that is opposite to the first side; and conductive rails formed buried in the substrate, the conductive rails interconnecting the second wiring layers on the second side of the substrate with the transistor devices and the first wiring layer on the first side of the substrate, wherein the conductive rails are parallel power rails to provide power to the transistor devices that are formed on the first side of the substrate, wherein the conductive rails are formed of a conductive stack including a conductive material with a threshold temperature for thermal stability being lower than 500° C., wherein a longitudinal direction of the semiconductor device and of each of the parallel power rails is a second direction that is orthogonal to a first direction extending from the first side to the second side of the substrate, wherein respective side walls of the parallel power rails extend throughout an entirety of the substrate in the first direction and are parallel to each other throughout the entirety of the substrate in the first direction, wherein the second wiring layers form a power delivery network to deliver power from an external power source to the parallel power rails, wherein the parallel power rails include a first set of power rails connected to a low-voltage level and a second set of power rails connected to a high-voltage level, power rails in the first set and power rails in the second set being alternately arranged in a third direction perpendicular to both the first and second directions, wherein the transistor devices include cells arranged in at least a first row and an adjacent second row, each of the first and second rows extending in the longitudinal direction of each of the parallel power rails, and wherein the cells in the first row have corresponding high-power and low-power connections arranged in a first orientation with respect to the third direction and the cells in the second row have corresponding high- and low-power connections arranged in a second orientation with respect to the third direction, the second orientation being opposite to the first orientation, and a first power rail in the first set of power rails connected to the low-voltage level provides the low-voltage level to the low-power connections of the cells in both the first row and the second row.

2. The semiconductor device of claim 1, wherein a depth of the conductive rails is greater than 500 nanometers.

3. The semiconductor device of claim 1, wherein a width of each of the parallel power rails in the third direction is at least twice a width of routing tracks formed on the first side of the substrate.

* * * * *